United States Patent
Kubota

(10) Patent No.: US 8,111,109 B2
(45) Date of Patent: Feb. 7, 2012

(54) TEMPERATURE COMPENSATED PIEZOELECTRIC OSCILLATOR

(75) Inventor: Hajime Kubota, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 3 days.

(21) Appl. No.: 12/621,359

(22) Filed: Nov. 18, 2009

(65) Prior Publication Data

US 2010/0123524 A1    May 20, 2010

(30) Foreign Application Priority Data

Nov. 20, 2008  (JP) ................................ 2008-296394
Nov. 2, 2009   (JP) ................................ 2009-251618

(51) Int. Cl.
*H03B 5/32* (2006.01)
*H03B 1/00* (2006.01)
*H03L 1/02* (2006.01)

(52) U.S. Cl. .......... 331/158; 331/68; 331/176; 310/315; 310/348

(58) Field of Classification Search .............. 331/68–70, 331/108 C, 116 M, 116 R, 154, 158, 176; 310/311, 315, 346, 348, 365
See application file for complete search history.

(56) References Cited

U.S. PATENT DOCUMENTS

| | | | | |
|---|---|---|---|---|
| 6,049,256 A | * | 4/2000 | Fry | ................................ 331/69 |
| 6,229,249 B1 | * | 5/2001 | Hatanaka et al. | ............. 310/348 |
| 7,098,580 B2 | * | 8/2006 | Sasagawa et al. | ............. 310/348 |
| 7,382,204 B2 | * | 6/2008 | Arai et al. | ........................ 331/69 |
| 7,551,040 B2 | * | 6/2009 | Harima | ........................... 331/68 |
| 7,821,346 B2 | * | 10/2010 | McCracken | ..................... 331/69 |

FOREIGN PATENT DOCUMENTS

| | | |
|---|---|---|
| JP | 2005-286892 A | 10/2005 |
| JP | 2007-160492 A | 6/2007 |
| WO | 2004/095696 A2 | 11/2004 |

* cited by examiner

*Primary Examiner* — Levi Gannon
(74) *Attorney, Agent, or Firm* — Westerman, Hattori, Daniels & Adrian, LLP

(57) ABSTRACT

An oscillator that includes a movable element formed of silicon, the movable element vibrating by electrostatic force, a stationary element supporting the movable element, a temperature detector located in contact with the stationary element, the temperature detector detecting the temperature of the stationary element, a supporting element joined to a joint surface between the movable element and the stationary element, the supporting element supporting the movable element, the stationary element, and the temperature detector on a surface opposite to the joint surface, a surrounding element contacted with the supporting element, the surrounding element and the supporting element surround the movable element, and electrodes provided on a surface of the surrounding element opposite to a surface of surrounding element contacted with the supporting element.

4 Claims, 9 Drawing Sheets

TEMPERATURE COMPENSATED PIEZOELECTRIC OSCILLATOR

CROSS-REFERENCE TO RELATED APPLICATIONS

This application is related to and claims priority to Japanese Patent Application No. 2008-296394, filed on Nov. 20, 2008, and incorporated herein by reference.

This application is related to and claims priority to Japanese Patent Application No. 2009-251618, filed on Nov. 2, 2009, and incorporated herein by reference.

FIELD

The embodiments discussed herein are related to an oscillator.

BACKGROUND

Japanese Laid-open Patent Publication No. 2005-286892 discloses an oscillator that is formed as single chip by combining a vibrator made of silicon (Si), a temperature sensor for detecting the temperature of the vibrator, and peripheral circuits such as a phase-locked loop (PLL), thereby minimizing the frequency variation of the vibrator according to the detected temperature.

On such a chip, circuits can be formed using a CMOS process, since the vibrator is also made of Si.

SUMMARY

According to an aspect of the invention, an oscillator includes a movable element formed of silicon, the movable element vibrating by electrostatic force, a stationary element supporting the movable element, a temperature detector located in contact with the stationary element, the temperature detector detecting the temperature of the stationary element, a supporting element joined to a joint surface between the movable element and the stationary element, the supporting element supporting the movable element, the stationary element, and the temperature detector on a surface opposite to the joint surface, a surrounding element contacted with the supporting element, the surrounding element and the supporting element surround the movable element, and electrodes provided on a surface of the surrounding element opposite to a surface of surrounding element contacted with the supporting element.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Si is a material having relatively temperature-sensitive characteristic in that only a little difference in temperature may cause a large change in the oscillation frequency. For this reason, when the vibrator is located far from the temperature sensor, a difference may occur between the temperature of the vibrator and the temperature detected by the temperature sensor, which makes it difficult for the vibrator to generate a stable frequency.

Figure 1:
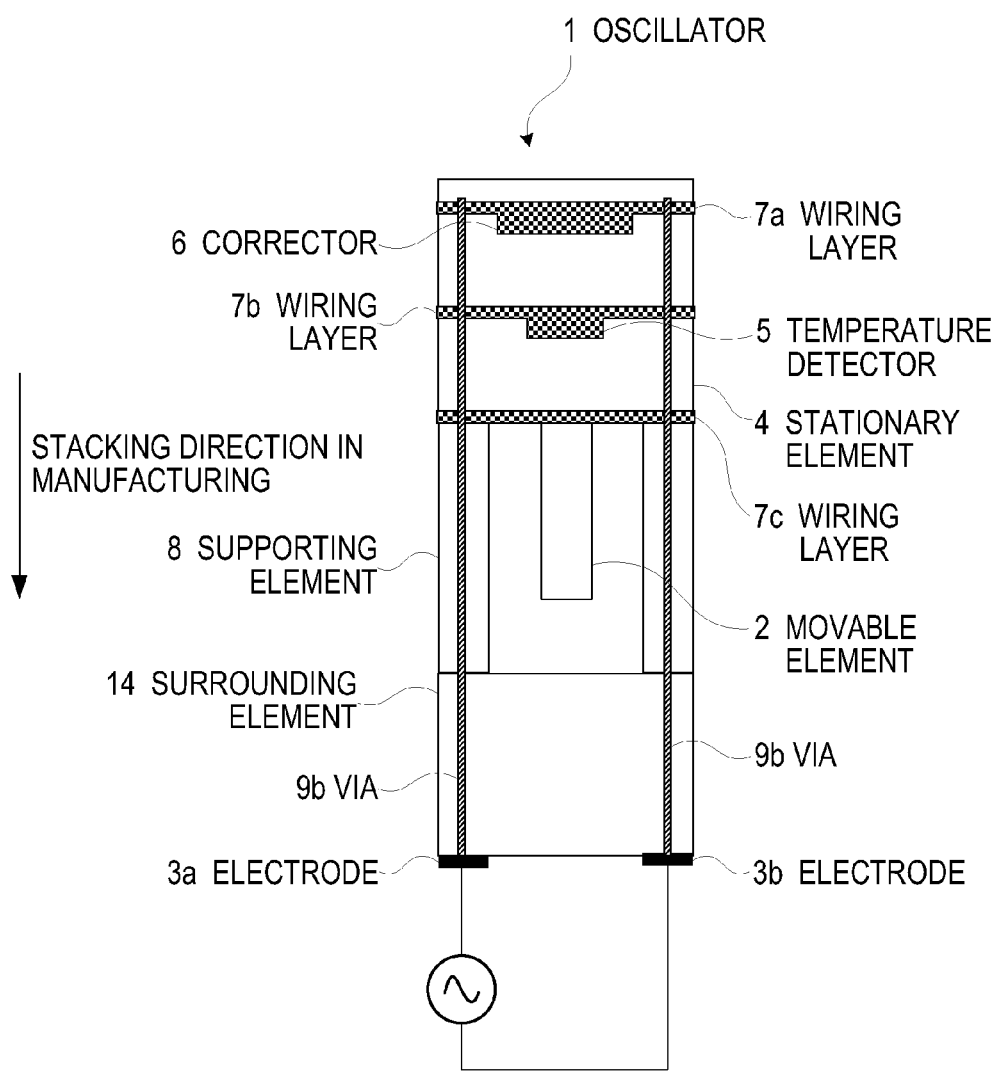
FIG. 1 is a schematic diagram of an oscillator in accordance with an embodiment.

FIG. 1 is a schematic diagram of an oscillator in accordance with an embodiment.

An oscillator 1 includes a movable element 2, electrodes 3a, 3b, a stationary element 4, a temperature detector 5, a corrector 6, a supporting element 8, and a surrounding element 14.

The movable element 2 has a plate shape, is formed of silicon, and can be displaced in the thickness direction (the horizontal direction in FIG. 1).

The electrodes 3a, 3b apply an (AC) voltage to the movable element 2 to displace the movable element 2 by electrostatic force. A printed circuit board is to be placed on the surface that includes the electrodes 3a, 3b.

The stationary element 4 is formed of silicon and supports a wiring layer 7c for supporting at least a portion of the movable element 2. The movable element 2 is supported on the surface opposite to the surface that includes the electrodes 3a, 3b.

The temperature detector 5 is provided in contact with the stationary element 4 and detects the temperature of the stationary element 4.

The corrector 6 performs correction according to the temperature detected by the temperature detector 5 so as to keep constant the output frequency derived from the output of the movable element 2.

Wiring layers 7a and 7b, and the wiring layer 7c have wiring patterns for supplying power to the movable element 2, the temperature detector 5, and the corrector 6, and transferring input and output signals.

The supporting element 8 maintains a space in which the movable element 2 moves, and supports the movable element 2, the stationary element 4, the temperature detector 5, the corrector 6, and the wiring layers 7a, 7b, 7c.

The surrounding element 14 is located in contact with the supporting element 8. The electrodes 3a, 3b are provided on a surface of surrounding element 14 opposite to a surface of surrounding element 14 contacted with the supporting element 8. The surrounding element 14 and the supporting element 8 surround the movable element 2 with a predetermined gap therebetween.

VIAS 9a, 9b electrically connect the electrodes 3a, 3b and the wiring layers 7a, 7b, 7c and cause the movable element 2, the temperature detector 5, and the corrector 6 to operate as an oscillator.

Configuring the oscillator 1 in such a way allows the electrodes 3a, 3b to be formed after stacking the supporting element 8 and the surrounding element 14 in a manufacturing process of the oscillator 1 described later. It is very difficult to form each layer after forming the electrodes 3a, 3b. Also, forming the electrodes 3a, 3b on the surface opposite to the surface on which the movable element is supported eliminates the need for the wiring from the printed circuit board to the electrodes 3a, 3b to pass through the side portion of the oscillator 1. As a result, an area for placing the oscillator 1 on the printed circuit board can be reduced.

Figure 2:
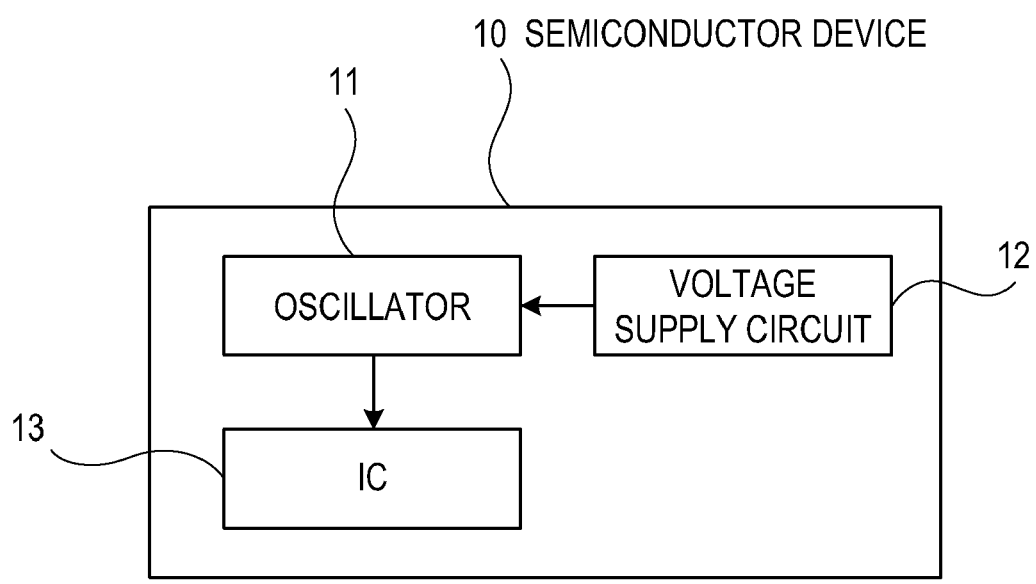
FIG. 2 illustrates a semiconductor device in accordance with the embodiment.

FIG. 2 illustrates a semiconductor device in accordance with the embodiment.

A semiconductor device 10 includes an oscillator 11, a voltage supply circuit 12, and an IC 13.

The oscillator 11 generates an oscillation signal used as a clock signal for the IC 13.

The voltage supply circuit 12 supplies an AC voltage for causing the oscillator 11 to oscillate and a bias voltage described later.

The IC 13 operates using the oscillation signal from the oscillator 11 as the clock signal.

Figure 3:
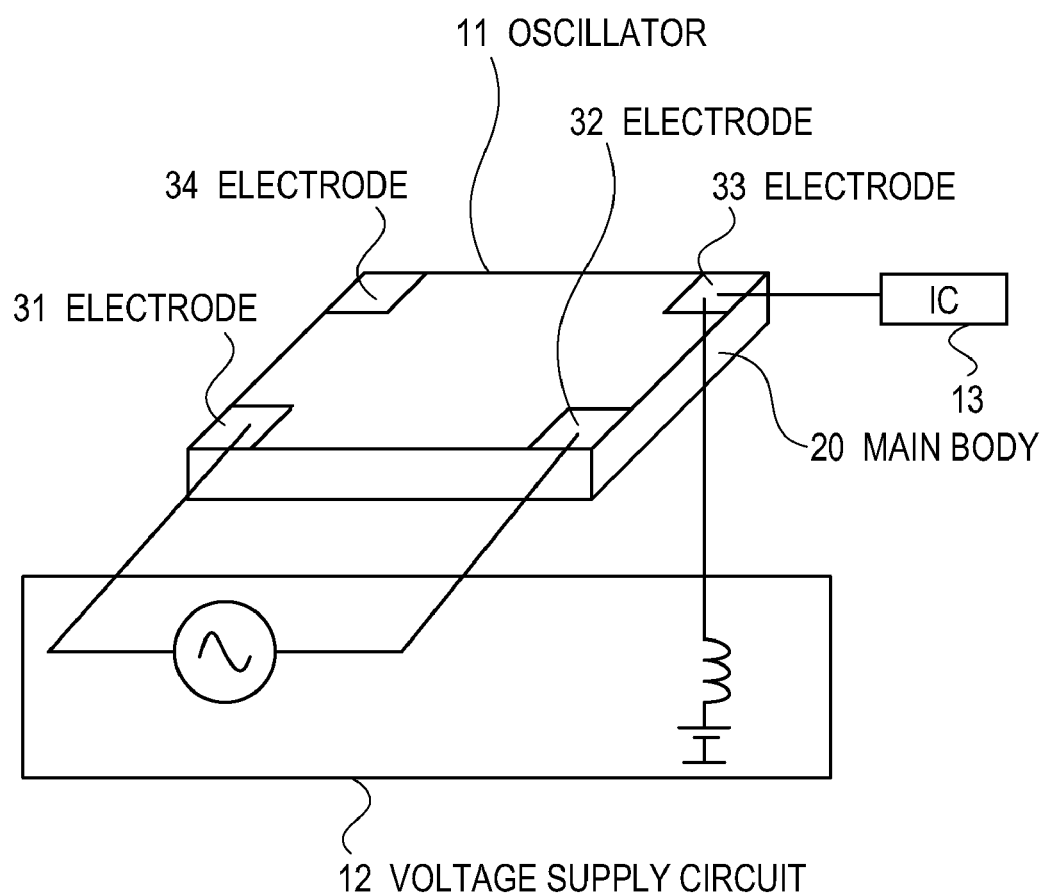
FIG. 3 is a perspective view illustrating the oscillator.

FIG. 3 is a perspective view illustrating the oscillator.

The oscillator 11 includes a main body 20 having a rectangular plate shape and electrodes 31-34 provided on the four corners of the main body 20.

The electrode 31 is a terminal to which a voltage is applied from a voltage supply circuit 12. The electrode 32 is a GND terminal. The electrode 33 is an output terminal for the oscillation signal from the oscillator 11. The electrode 34 is an input terminal for an enable signal for enabling/disabling the oscillation.

Figure 4:
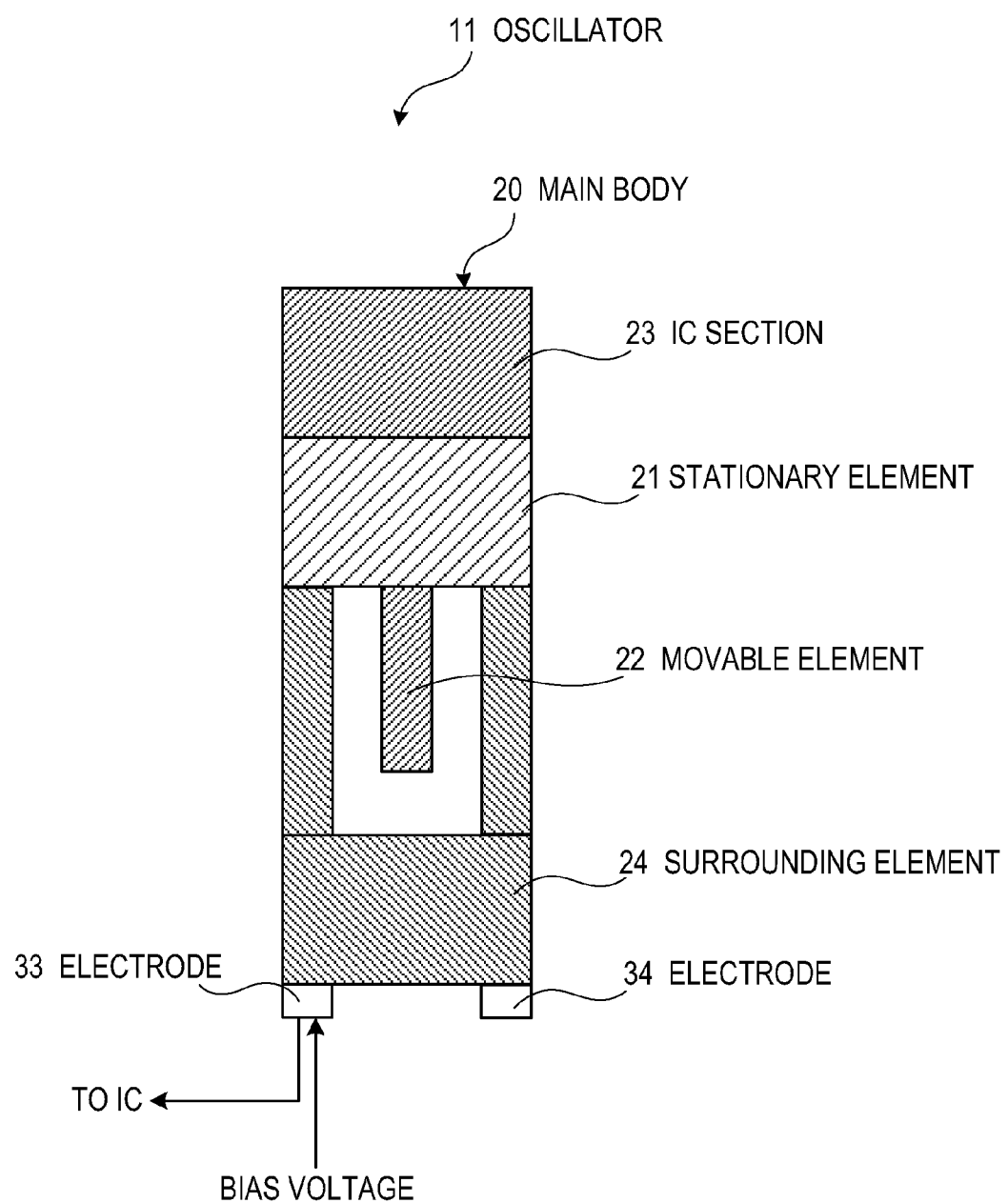
FIG. 4 is a cross-sectional view illustrating the configuration of the oscillator.

FIG. 4 is a cross-sectional view of the oscillator. Note that, the upper, lower, left, and right sides of FIG. 4 is referred to as "Top," "Bottom," "Left," and "Right," respectively. Also, in FIG. 4, the shape of the oscillator 11 is exaggerated in the vertical direction.

The main body 20 includes: a stationary element 21 having a function as a temperature sensor; a movable element (MEMS (Micro Electro Mechanical Systems) vibrator) 22 having a columnar shape, one end of which is fixed to the stationary element 21 and the other end of which is free; an IC section (temperature detector) 23 provided on the stationary element 21 opposite to the movable element 22; and a surrounding element 24 surrounding the movable element 22 with a predetermined gap therebetween.

The height of the stationary element 21 (vertical height) is approximately 1 μm, for example.

The stationary element 21 supports one end (the bottom) of the movable element 22 so as not to displace the end.

The height of the movable element 22 is approximately 1 μm, for example.

The movable element 22 is connected to the electrode 33 via a Via (not illustrated).

Note that the shape and size of the movable element 22 is not limited to the illustrated shape.

The IC section 23 detects the temperature (of the stationary element 21) transferred from the stationary element 21. Then, depending on the temperature, the IC section 23 corrects the output frequency of the oscillator according to a correction program preinstalled in the IC section 23 so that the frequency of the oscillation signal supplied to the IC 13 will be constant.

Specifically, the temperature information read by the temperature sensor is converted to a voltage that is transferred to the IC 13. The IC 13 is provided in advance with correction information in its memory, and selects correction information depending on the read voltage and uses the selected information for adjusting the output frequency of the oscillator.

The temperature of the movable element 22 is transferred immediately to the stationary element 21. So, the correction by the IC section 23 can correctly follow the change in the temperature, thus keeping the frequency of the oscillation signal constant.

Also, the IC section 23 is separated from the movable element 22 by the stationary element 21, which prevents the vibration of the movable element 22 from being directly transferred to the IC section 23.

The surrounding element 24 forms an airtight space all around the movable element 22 by surrounding the side and top portions of the movable element 22.

Employing this configuration, the oscillator 11 can be easily manufactured.

Next, the operation of the oscillator 11 will be described with reference to FIGS. 3 and 4.

When the oscillator 11 is in operation, a DC bias voltage is applied from the voltage supply circuit 12 to the movable element 22 via the electrode 33 in order to appropriately maintain the amount of electric charge in the movable element 22.

When an AC voltage is applied between the electrodes 31, 32 from the voltage supply circuit 12, an electrostatic force is generated between the electrode 31 and the movable element 22. The movable element 22 is displaced in the thickness direction (the horizontal direction in FIG. 3) by this electrostatic force. In other words, the movable element 22 vibrates at the resonance frequency. A voltage obtained by amplifying this vibration with an amplifier (not illustrated) is outputted from the electrode 33. This voltage is supplied to the IC 13.

Figure 5A:
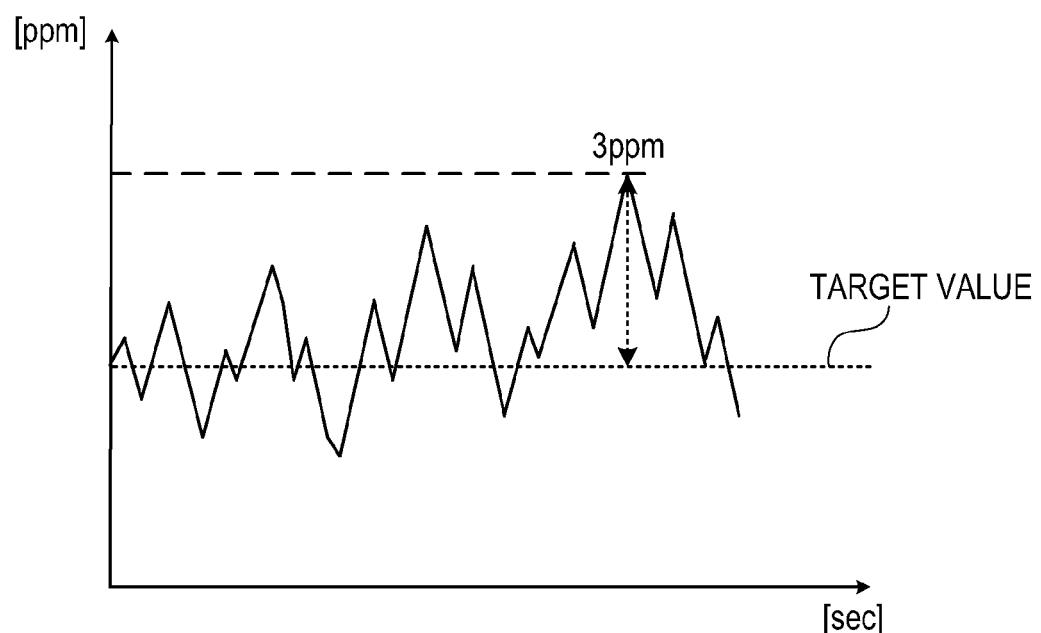
FIGS. 5A and 5B illustrate frequency variation characteristics of oscillators.
Figure 5B:
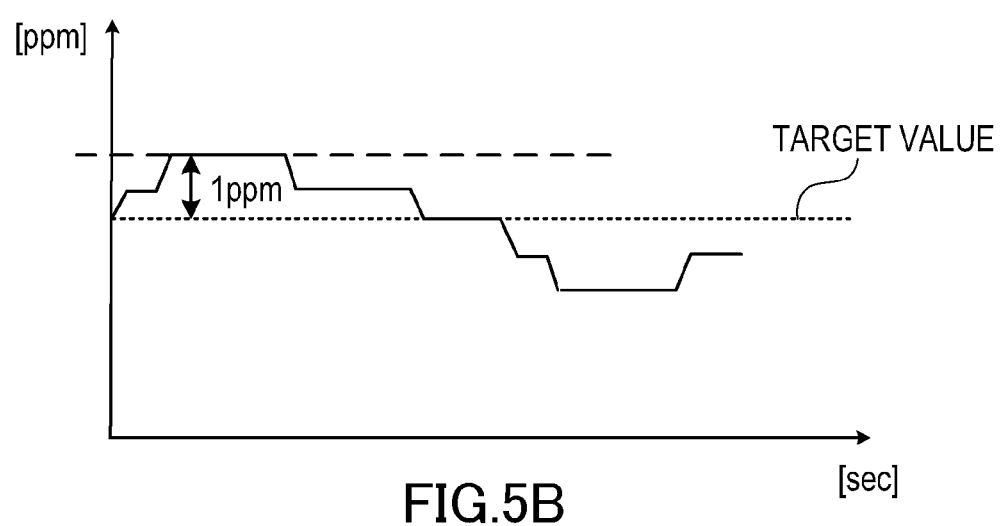

FIGS. 5A and 5B illustrate frequency variation characteristics of oscillators. FIG. 5B illustrates a frequency variation characteristic of the oscillator in accordance with the embodiment. FIG. 5A illustrates a frequency variation characteristic of a comparative example of an oscillator.

The comparative example of the oscillator (not the oscillator 11) is an oscillator that includes an IC having a temperature sensor embedded in the IC. In this oscillator, the temperature transferred to the temperature sensor may often be different from the actual temperature of the point at which oscillation is performed (corresponding to the movable element 22). Then, as illustrated in FIG. 5A, the correction done in order to correct the temperature to the target value was not appropriate, and thus the waveform did not become stable. For example, in FIG. 5A, the maximum error between the corrected value and the target value is 3 ppm.

On the other hand, as illustrated in FIG. 5B, in the oscillator 11, which includes the temperature sensor in the stationary element 21, the accurate temperature information of the movable element 22 can be transferred to the IC section 23, which can make the oscillator 11 highly precise and stable. For example, in FIG. 5B, the maximum error between the corrected value and the target value is 1 ppm. Also, the frequency variation can be reduced.

Next, a manufacturing process of the oscillator 11 will be described.

FIGS. 6 and 7 illustrate a manufacturing process of the oscillator.

Figure 6A:
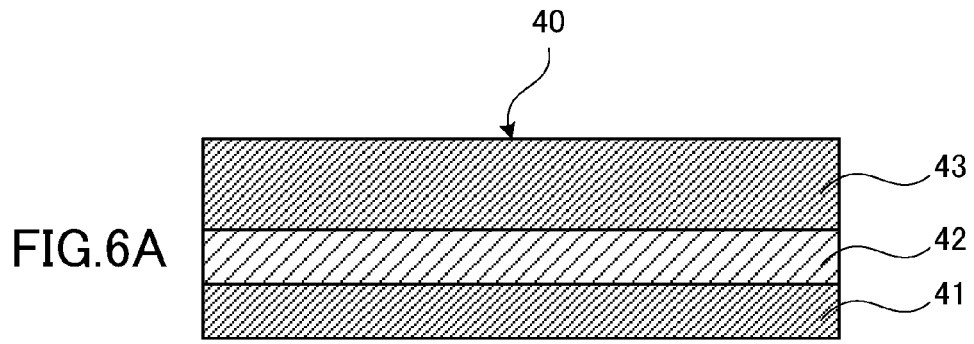
FIGS. 6A-6D illustrate a manufacturing process of the oscillator.

As illustrated in FIG. 6A, a substrate 40 is provided by stacking an IC substrate 41 in which a plurality of IC sections 23 are disposed at predetermined intervals, a first silicon substrate (wafer) 42, and a second silicon substrate (wafer) 43 in this order.

Each of the IC substrate 41, the first silicon substrate 42, and the second silicon substrate 43 has a thickness of approximately 1 μm, for example. In FIG. 6A, the thickness of the second silicon substrate 43 is illustrated enlarged for more understandable description.

Figure 6B:
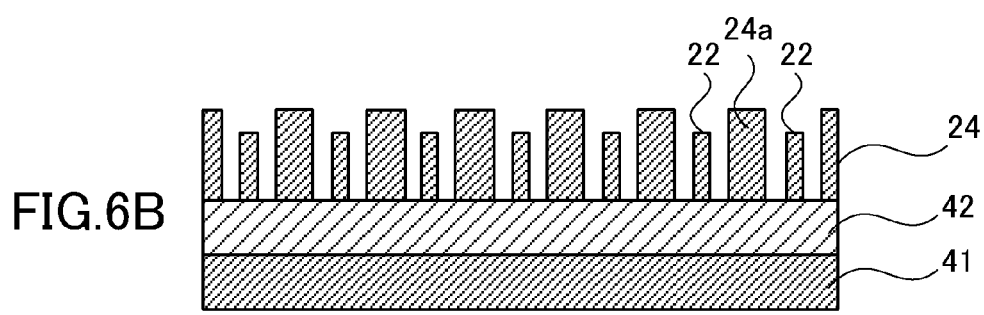

As illustrated in FIG. 6B, movable elements 22, the side portions of surrounding elements 24, and structures 24a to be the side portions of surrounding elements 24 later are formed by performing etching on the second silicon substrate 43.

Figure 6C:
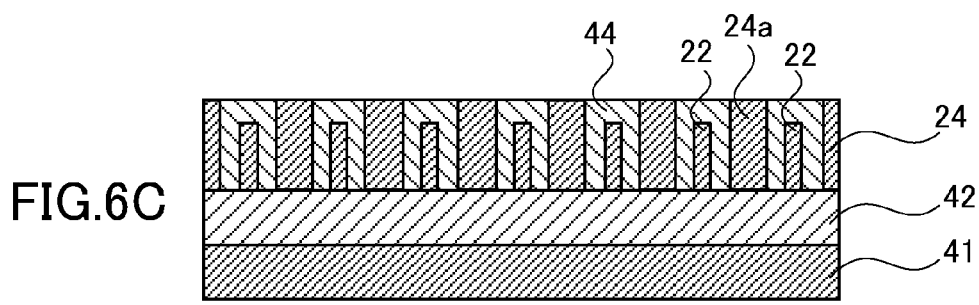

As illustrated in FIG. 6C, a SiO₂ layer 44 is formed by providing SiO₂ so as to fill the gaps between the movable elements 22 and the side portions of the surrounding elements 24, and the gaps between the movable elements 22 and the structures 24a.

Figure 6D:
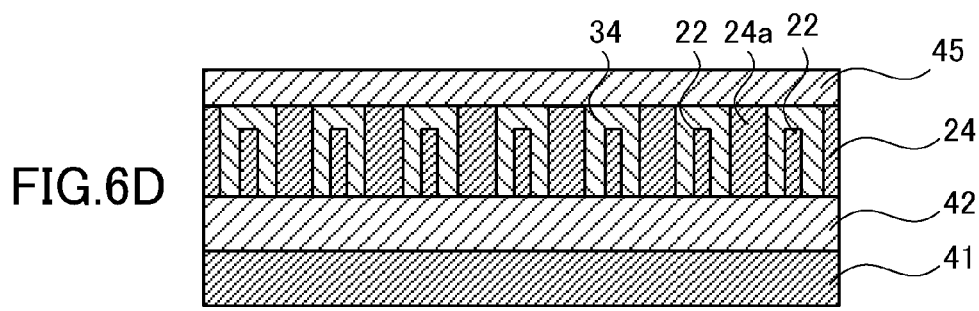

As illustrated in FIG. 6D, upper surfaces of the surrounding elements 24, the structures 24a, and the SiO₂ layer 44 are covered with a poly-silicon (Poly-Si) 45.

Figure 7E:
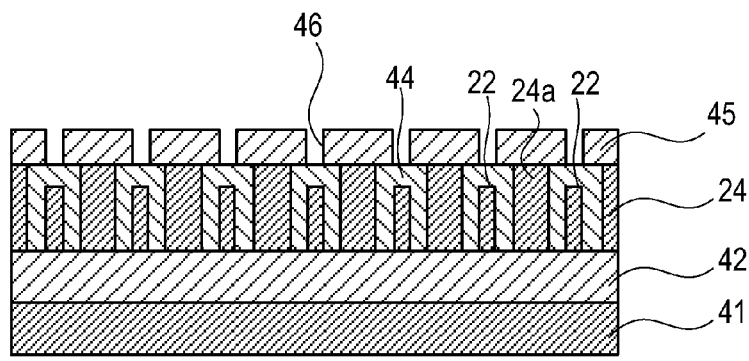
FIGS. 7E-7H illustrate the manufacturing process of the oscillator.

As illustrated in FIG. 7E, openings 46 for sacrificial layer etching are formed in the poly-silicon 45 at the locations corresponding to the upper surfaces of the movable elements 22.

Figure 7F:
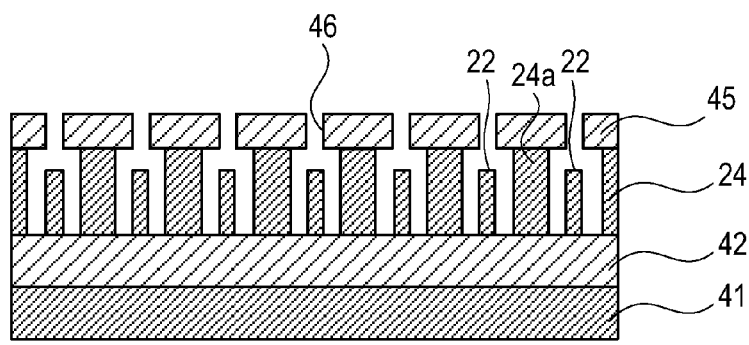

As illustrated in FIG. 7F, the SiO₂ layer 44 is removed by performing etching from the openings 46.

Figure 7G:
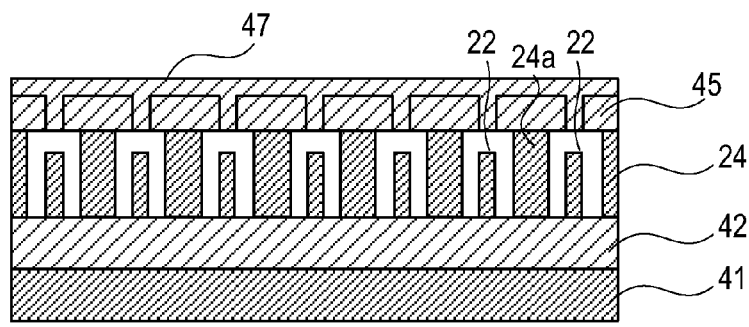

As illustrate in FIG. 7G, the opening of the openings 64 is sealed with a poly-silicon 47. At this point, the upper portions of the surrounding elements 24 are formed by using the poly-silicon 45 and 47.

Figure 7H:
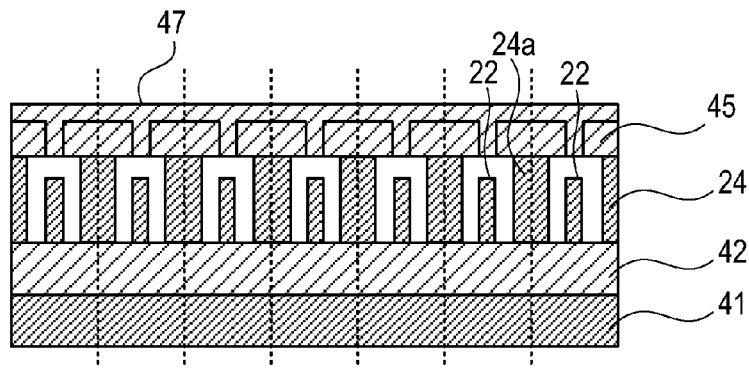

As illustrate in FIG. 7H, dicing is performed at the center of each structure 24a. In this way, main bodies 20 are obtained.

Then, electrodes 31-34 are joined to (placed on) the four corners of each main body 20.

As described above, the IC section 23 of the oscillator 11 is configured to detect the temperature of the stationary element 21 including the temperature sensor, so accurate temperature information is transferred to the IC section 23.

Accordingly, even if the movable element 22 is formed of silicon, a highly precise and stable oscillation signal can be supplied to the IC 13.

Note that, as long as the configuration is such that the stationary element supports a portion of the movable element and the IC section detects the temperature of the stationary element, the shape of the oscillator is not limited to that of the embodiment. Variations are shown below.

Figure 8:
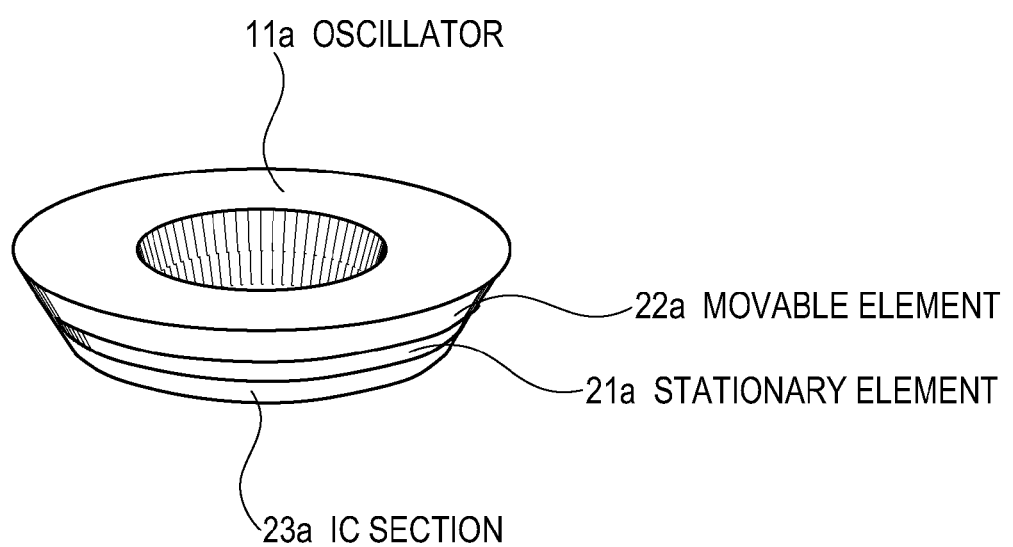
FIG. 8 illustrates a variation of the oscillator.
Figure 9:
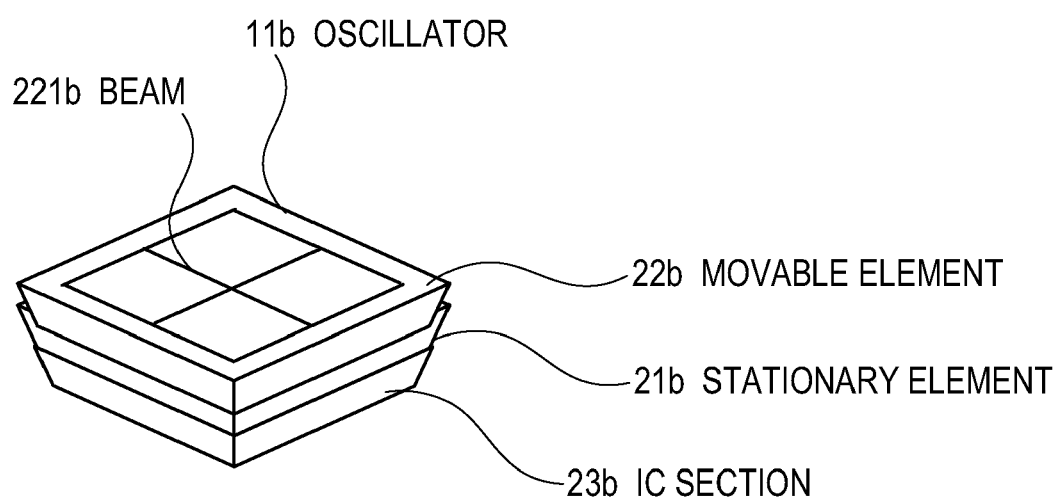
FIG. 9 illustrates another variation of the oscillator.

FIGS. 8 and 9 illustrate variations of the oscillator.

An oscillator 11a illustrated in FIG. 8 includes: a stationary element 21a having a circular plate shape; a hollow-body movable element 22a having a circular plate shape; and an IC section 23a having a circular plate shape. A surrounding element and electrodes for the oscillator 11a are not illustrated.

Each of the stationary element 21a, the movable element 22a, and the IC section 23a has a thickness of approximately 1 μm, for example.

An oscillator 11b illustrated in FIG. 9 includes: a stationary element 21b having a rectangular plate shape; a hollow-body movable element 22b having a rectangular plate shape; and an IC section 23b having a rectangular plate shape.

In the movable element 22b, beams 221b are provided to connect opposite sides.

Each of the stationary element 21b and the movable element 22b has a thickness of approximately 1 μm, for example.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that various changes, substitutions, and alterations could be made hereto without departing from the spirit and scope of the invention.

The invention claimed is:

1. An oscillator comprising:
   a movable element formed of silicon, the movable element vibrating by electrostatic force;
   a stationary element supporting the movable element;
   a temperature detector located in contact with the stationary element, the temperature detector detecting the temperature of the stationary element;
   a supporting element joined to a joint surface between the movable element and the stationary element, the supporting element supporting the movable element, the stationary element, and the temperature detector on a surface opposite to the joint surface;
   a surrounding element contacted with the supporting element, the surrounding element and the supporting element surround the movable element; and
   electrodes provided on a surface of the surrounding element opposite to a surface of surrounding element contacted with the supporting element;
   a first wiring layer between the movable element and the stationary element;
   a second wiring layer joined to the temperature detector; and
   vias passing through the supporting element and the surrounding element and electrically joined to the first wiring layer, the second wiring layer, and the electrodes.

2. The oscillator according to claim 1, further comprising:
   a corrector, supported by the supporting element, for correcting the output of the movable element according to the temperature detected by the temperature detector; and
   a third wiring layer joined to the corrector and electrically joined to the vias.

3. An electronics apparatus comprising:
   a movable element that is formed of silicon and vibrates by electrostatic force;
   a stationary element for supporting the movable element;
   a temperature detector, located in contact with the stationary element, for detecting the temperature of the stationary element;
   a supporting element, joined to a joint surface between the movable element and the stationary element, for supporting the movable element, the stationary element, and the temperature detector on a surface opposite to the joint surface;
   a surrounding element contacted with the supporting element, the surrounding element and the supporting element surround the movable element;
   electrodes provided on a surface of the surrounding element opposite to a surface of surrounding element contacted with the supporting element;
   a circuit that operates using an oscillation signal generated from the vibration of the movable element as a clock signal;
   a first wiring layer between the movable element and the stationary element;
   a second wiring layer joined to the temperature detector; and
   vias passing through the supporting element and the surrounding element and electrically joined to the first wiring layer, the second wiring layer, and the electrodes.

4. The electronics apparatus according to claim 3, further comprising a corrector, supported by the supporting element, for correcting the output of the movable element according to the temperature detected by the temperature detector.

* * * * *